US 6,920,049 B2
Jul. 19, 2005

(12) United States Patent
Brooks et al.

(54) BLADED SERVERS

(75) Inventors: Michael Alan Brooks, Sacramento, CA (US); Michael J. Greenside, Granite Bay, CA (US); Glenn Simon, Auburn, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 112 days.

(21) Appl. No.: 10/358,771

(22) Filed: Feb. 5, 2003

(65) Prior Publication Data

US 2004/0150950 A1 Aug. 5, 2004

(51) Int. Cl.[7] ................................................. G06F 1/16
(52) U.S. Cl. ...................... 361/727; 312/319; 710/302; 16/271
(58) Field of Search ................................. 361/724–727, 361/679–687; 312/298, 299, 301, 319; 710/302; 439/327; 16/266, 268, 271

(56) References Cited

U.S. PATENT DOCUMENTS

| | | | |
|---|---|---|---|
| 5,460,441 A | 10/1995 | Hastings et al. | |
| 6,058,011 A | 5/2000 | Hardt et al. | ................. 361/694 |
| 6,181,552 B1 | 1/2001 | Neville, Jr. et al. | ......... 361/686 |
| 6,325,636 B1 | 12/2001 | Hipp et al. | .................... 439/61 |
| 6,350,140 B1 * | 2/2002 | Gallagher et al. | ........... 439/327 |
| 6,411,506 B1 | 6/2002 | Hipp et al. | .................. 361/686 |
| 6,530,628 B1 * | 3/2003 | Huang et al. | ............. 312/223.2 |
| 6,742,068 B2 * | 5/2004 | Gallagher et al. | .......... 710/302 |
| 2003/0117782 A1 | 6/2003 | Wrycraft et al. | |

FOREIGN PATENT DOCUMENTS

| | | |
|---|---|---|
| GB | 2378584 | 2/2003 |
| JP | 10070385 | 3/1998 |
| WO | WO 03103359 | 12/2003 |

OTHER PUBLICATIONS

HP Blade Server Chassis bn7800 Overview & Features.
HP Manageability Solution Brief: HP Blade Server Environment.
Tom Manter (Nov. 14, 2001) Aberdeen Group, Inc Insight; Blades: An Evolution in Server Density.

* cited by examiner

Primary Examiner—Hung Van Duong

(57) ABSTRACT

A bladed server with a chassis having a front and rear is provided. A plurality of blades is disposed within the chassis so that opposing faces and a faceplate of each of the plurality of blades are substantially perpendicular to the front and rear of the chassis. The plurality of blades includes at least one server blade. One or more fans are located at at least one of the front and rear of the chassis such that a flow-path at at least one of an inlet and exit of the one or more fans is substantially parallel to the opposing faces and faceplate of each of the plurality of blades.

24 Claims, 4 Drawing Sheets

BLADED SERVERS

FIELD OF THE INVENTION

The present invention relates generally to bladed servers.

BACKGROUND

Computers, such as personal computers, are often connected to data networks, such as the Internet, for enabling data to be transferred from one computer to another computer. When multiple computers share large amounts of data, a server is often connected to the data network to provide data to the computers. Servers enable many computers to access information that is stored within the network.

Bladed servers are one type of server. Bladed servers are comprehensive computing systems that include a processor, memory, network connections, and associated electronics all on a single or multiple circuit cards called a server blade, for example. In one application, one or more server blades are contained in a chassis, along with server appliance blades, network-switch blades, storage blades, management blades, local-area-network-(LAN-) blades, and other blades. In many applications, several chassis are stacked vertically in vertical rack cabinets or are placed side by side in horizontal rack cabinets.

A chassis typically includes a backplane or midplane that is oriented so that a faceplate of the backplane or midplane is substantially parallel to a front of the rack cabinet. The various blades are electrically connected to the backplane or midplane and are usually oriented so they are substantially perpendicular to the faceplane and so a faceplate of each of the blades is substantially parallel to the faceplane and thus the front of the rack cabinet. In this orientation, the faceplates of the blades coincide with a front of the chassis and close the front of the chassis.

Blades normally dissipate heat that if not removed from the blades and subsequently from the chassis can cause the blades to fail. Consequently, many chassis include fans for creating airflow through the chassis for cooling the blades. In many applications, the air flows parallel to the blades and to faceplates of the blades. Moreover, in many applications, such as governed by industry specifications, e.g., promulgated by PCI (Peripheral Component Interconnect) Industrial Computers Manufacturers Group (PICMG), air must enter rack-mounted chassis at a front of the rack cabinet and exit the chassis at the rear of the rack cabinet. Therefore, for these applications, air enters the front of the chassis, turns by substantially 90 degrees so as to flow parallel to the faceplates and the blades, and turns by substantially 90 degrees so as to exit at the rear of the chassis.

One problem with this is that each time the airflow turns it loses momentum that reduces the efficiency and thus the cooling effect of the airflow. Moreover, unobstructed space is typically required to allow the air to turn, and plenums, baffles or the like are normally used to turn the airflow. For example, when chassis are stacked vertically within a vertical rack cabinet, plenums and/or baffles are often located at a bottom and top of each chassis. This increases the height of each chassis, thus decreasing the number of chassis that can be located within the rack cabinet. Similarly, when chassis are placed side by side in horizontal rack cabinets, plenums and/or baffles are often located on either side of each chassis, thereby decreasing the number of chassis that can be located within the rack cabinets.

For the reasons stated above, and for other reasons stated below that will become apparent to those skilled in the art upon reading and understanding the present specification, there is a need in the art for alternatives for cooling blades of bladed servers.

SUMMARY

One embodiment of the present invention provides a bladed server with a chassis having a front and rear. A plurality of blades is disposed within the chassis so that opposing faces and a faceplate of each of the plurality of blades are substantially perpendicular to the front and rear of the chassis. The plurality of blades includes at least one server blade. One or more fans are located at at least one of the front and rear of the chassis such that a flow-path at at least one of an inlet and exit of the one or more fans is substantially parallel to the opposing faces and faceplate of each of the plurality of blades.

Another embodiment provides a method for cooling a bladed server. The method includes orienting a plurality of blades within a chassis so that a faceplate and opposing faces of each of the plurality of blades are perpendicular to a front of the chassis. One or more of the plurality of blades is a server blade. The method includes disposing one or more fans at at least one of the front and a rear of the chassis such that a flow-path at at least one of an inlet and exit of the one or more fans is substantially parallel to the opposing faces and faceplate of each of the plurality of blades. Creating a substantially horizontal airflow using the one or more fans that enters substantially horizontally at the front of the chassis, flows substantially horizontally along the opposing faces of each of the plurality of blades, and exits substantially horizontally at the rear of the chassis is also included in the method.

Further embodiments of the invention include methods and apparatus of varying scope.

DETAILED DESCRIPTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The following detailed description is, therefore, not to be taken in a limiting sense, and the scope of the present invention is defined only by the appended claims and equivalents thereof.

Figure 1:
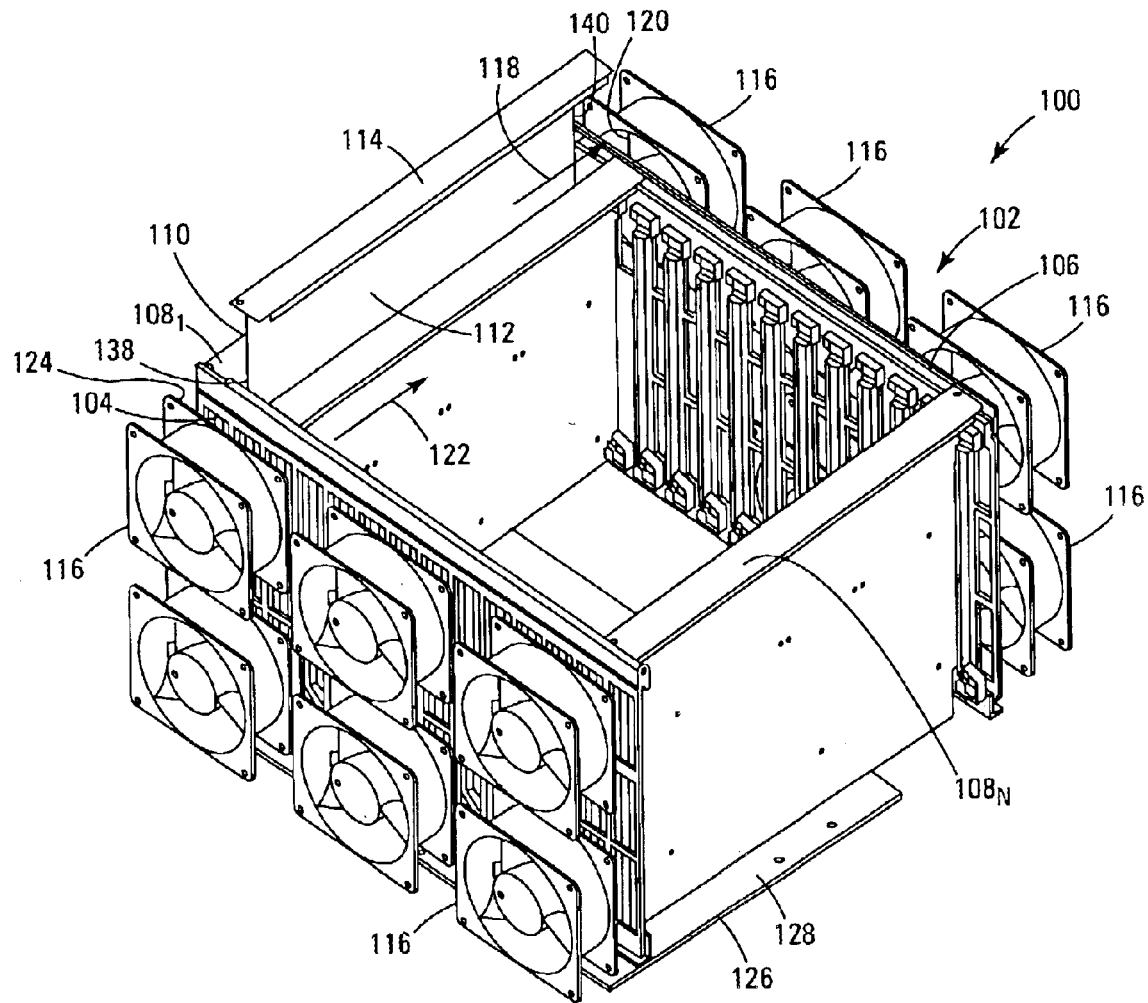
FIG. 1 is a perspective view of a bladed server according to an embodiment of the present invention.
Figure 2:
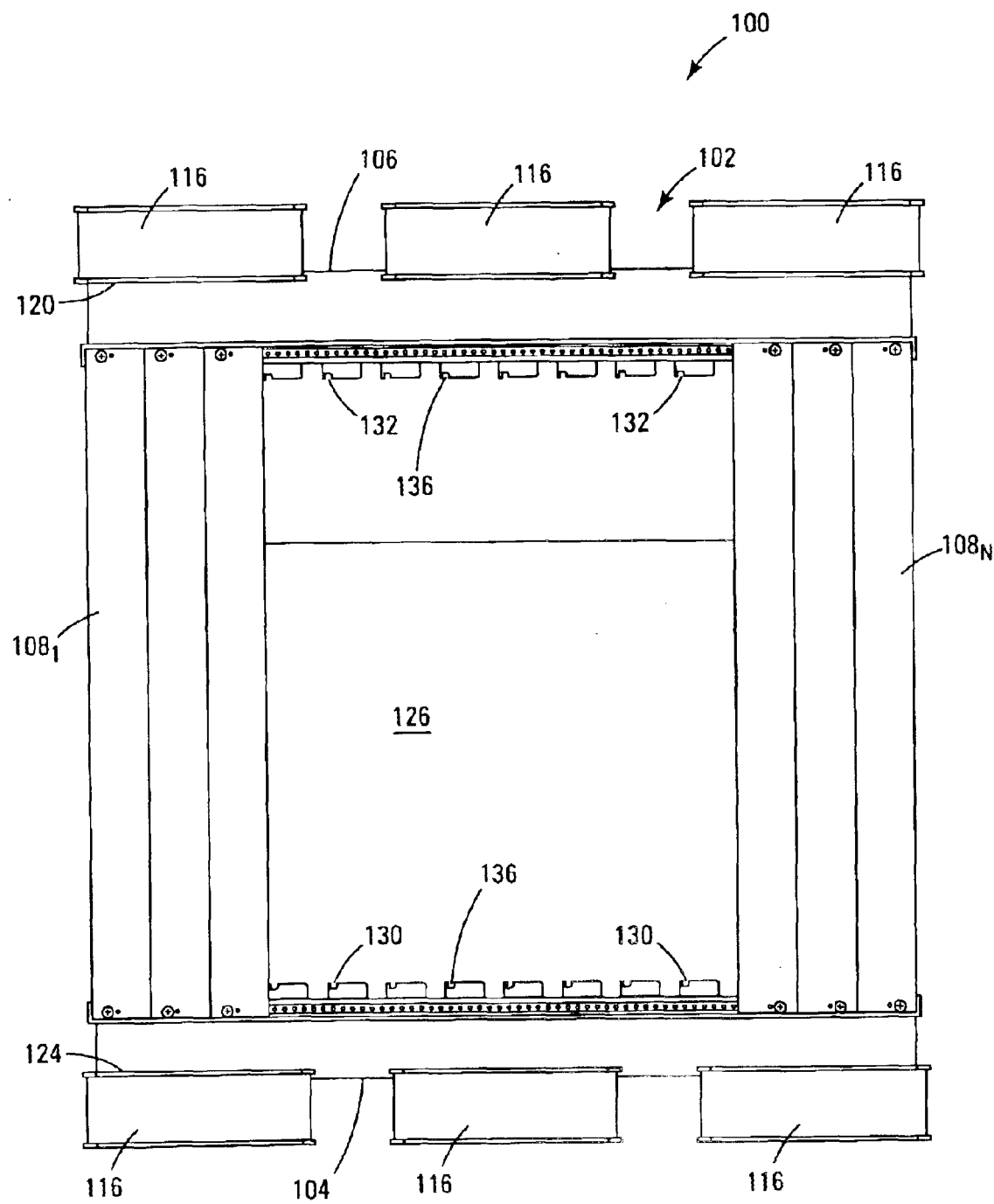
FIG. 2 is a top view of the bladed server of FIG. 1.

FIGS. 1 and 2 are respectively perspective and top views illustrating a bladed server 100 according to an embodiment of the present invention. Bladed server 100 includes a chassis 102 having a front 104 and rear 106. Blades (or circuit cards) $108_1$ to $108_N$ are disposed within chassis 102 between front 104 and rear 106. At least one of blades $108_1$ to $108_N$ is a server blade, e.g., a circuit card that provides a service for computers connected thereto via a network. In one embodiment, blades $108_1$ to $108_N$ include at least one of a storage blade, a management blade, and a network-switch blade. Each of blades $108_1$ to $108_N$ has opposing faces 110 and 112 and a faceplate 114, as shown in FIG. 1. Blades $108_1$ to $108_N$ are disposed within chassis 102 so that opposing faces 110 and 112 and faceplate 114 are substantially perpendicular to front 104 and rear 106 of chassis 102.

In one embodiment, fans 116 are located at front 104 and rear 106 of chassis 102, as shown in FIGS. 1 and 2. In another embodiment, fans 116 are located at either front 104 or rear 106 of chassis 102. Fans 116 are located so that a flow-path (indicated by arrow 118 in FIG. 1) at an inlet 120 of each of fans 116 is substantially parallel to opposing faces 110 and 112 and faceplate 114, as shown in FIG. 1. In another embodiment, fans 116 are located so that a flow-path (indicated by arrow 122 in FIG. 1) at an exit 124 of each of fans 116 is substantially parallel to opposing faces 110 and 112 and faceplate 114, as shown in FIG. 1.

In operation, fans 116 create an airflow that flows substantially horizontally from front 104 to rear 106. In particular, the airflow enters front 104 of chassis 102 substantially horizontally as indicated by arrow 122, flows substantially horizontally along and substantially parallel to the opposing faces 110 and 112 of each of blades $108_1$ to $108_N$, as indicated by arrows 118 and 122, and exits substantially horizontally at rear 106 of chassis 102, as indicated by arrow 118. In various embodiments, the airflow cools blades $108_1$ to $108_N$ by carrying heat away from blades $108_1$ to $108_N$.

A backplane or midplane 126 is disposed within chassis 102. Backplane or midplane 126 is oriented so that a faceplane 128 of backplane or midplane 126 is substantially perpendicular to front 104 and rear 106, as shown in FIG. 1. Each of blades $108_1$ to $108_N$ is electrically connected to backplane or midplane 126.

In one embodiment, slots 130 and 132 are disposed within chassis 102 and are respectively located adjacent front 104 and rear 106, as shown in FIG. 2. Each of slots 130 is respectively aligned with each of slots 132 to form aligned slot pairs 136, as shown in FIG. 2. Each of aligned slot pairs 136 receives one of blades $108_1$ to $108_N$. That is, opposing edges 138 and 140 (illustrated in FIG. 1) of each of blades $108_1$ to $108_N$ are respectively received in slots 130 and 132.

Figure 3:
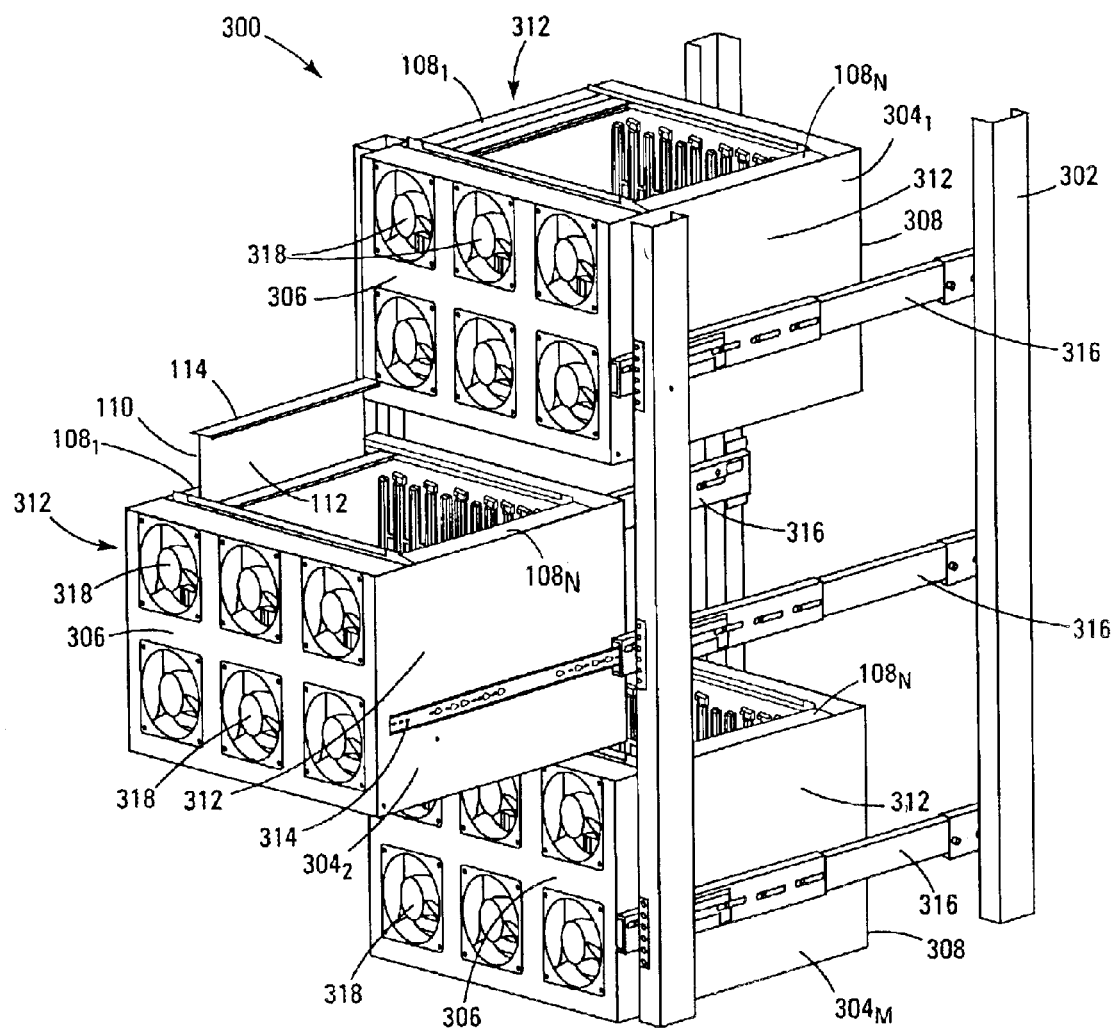
FIG. 3 is a perspective view of a bladed server according to another embodiment of the present invention.

FIG. 3 is a perspective view of a bladed server 300 according to another embodiment of the invention. Bladed server 300 includes a rack cabinet 302. Chassis $304_1$ to $304_M$ are movably mounted to rack cabinet 302 for moving between a first position and a second position. For one embodiment, chassis $304_1$ to $304_M$ are located within rack cabinet 302 and a front 306 of each of chassis $304_1$ to $304_M$ coincides with a front of rack cabinet 302 when in the first position, as illustrated for chassis $304_1$ and $304_M$ in FIG. 3. Chassis $304_1$ to $304_M$ extend from the front of rack cabinet 302 when in the second position, as illustrated for chassis $304_2$ in FIG. 3.

In one embodiment, blades $108_1$ to $108_N$, as described above, are disposed within each of chassis $304_1$ to $304_M$ between front 306 and a rear 308 of each of chassis $304_1$ and $304_M$. Blades $108_1$ to $108_N$ are disposed within each of chassis $304_1$ to $304_M$ so that opposing faces 110 and 112 and faceplate 114 are substantially perpendicular to front 306 and rear 308. The second position of chassis $304_1$ to $304_M$ provides access to blades $108_1$ to $108_N$.

For another embodiment, each of chassis $304_1$ to $304_M$ has opposing sides 312, each having a rail 314 attached thereto, as illustrated for chassis $304_2$. Rail 314 slides or rolls within a channel 316 of rack cabinet 302 SO that each of chassis $304_1$ to $304_M$ can move between the first and second positions, as discussed above. It will be appreciated by those skilled in the art that in this embodiment, each of chassis $304_1$ to $304_M$ operates as drawer.

In one embodiment fans 318 are located at front 306 of each of chassis $304_1$ to $304_M$. For other embodiments, each of chassis $304_1$ to $304_M$ are as described for chassis 102 of FIGS. 1 and 2 and include fans at the front and the rear. For another embodiment, fans are located at the rear only.

It will be appreciated that bladed server 300 is not limited to a vertical orientation with the chassis stacked one above the other, as shown in FIG. 3. Rather, bladed server 300 can be oriented horizontally with the chassis placed side by side.

In one embodiment, faceplate 114 of each of blades $108_1$ to $108_N$ coincides with a top of chassis 102 and faceplane 128 of backplane or midplane 126 is parallel to the top, as shown in FIGS. 1 and 2. In another embodiment, faceplate 114 of each of blades $108_1$ to $108_N$ coincides with a top of each chassis $304_1$ to $304_M$ as shown in FIG. 3.

Figure 4:
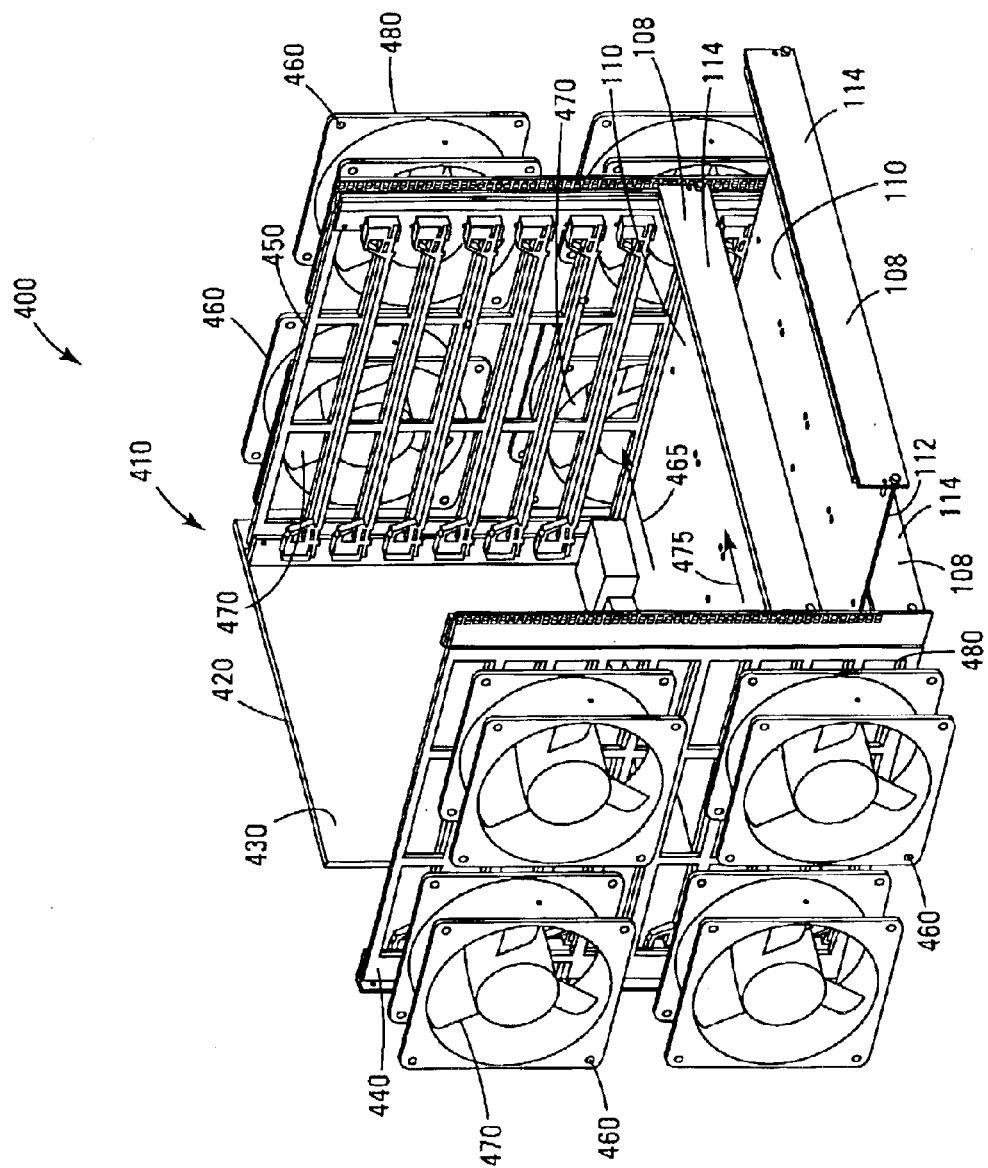
FIG. 4 is a perspective view of a bladed server according to yet another embodiment of the present invention.

In other embodiments, faceplate 114 of each of blades $108_1$ to $108_N$ coincides with a side of a chassis 410 of a bladed server 400, e.g., as illustrated for three of blades 108 in FIG. 4. In this embodiment, blades 108 are electrically connected to a backplane or midplane 420. Backplane or midplane 420 is located within chassis 410 so that a faceplane 430 of backplane or midplane 420 is parallel to the side of chassis 410, as shown in FIG. 4. Blades 108 are disposed within chassis 410 so that opposing faces 110 and 112 and faceplate 114 are substantially perpendicular to a front 440 and a rear 450 of chassis 410. In some embodiments, chassis 410 is disposed within a rack cabinet.

In one embodiment, fans 460 are located at front 440 and rear 450 of chassis 410, as shown in FIG. 4. In another embodiment, fans 440 are located at either front 440 or rear 450 of chassis 410. Fans 440 are located so that a flow-path (indicated by arrow 465 in FIG. 4) at an inlet 470 of each of fans 460 is substantially parallel to opposing faces 110 and 112 and faceplate 114, as shown in FIG. 4. In another embodiment, fans 460 are located so that a flow-path (indicated by arrow 475 in FIG. 4) at an exit 480 of each of fans 460 is substantially parallel to opposing faces 110 and 112 and faceplate 114, as shown in FIG. 4.

In operation, fans 460 create an airflow that flows substantially horizontally from front 440 to rear 450 of chassis 410. In particular, the airflow enters front 440 substantially horizontally, as indicated by arrow 475, flows substantially horizontally along the opposing faces 110 and 112 of each of blades 108, as indicated by arrows 465 and 475, and exits substantially horizontally at rear 450 of chassis 410, as indicated by arrow 465.

CONCLUSION

Embodiments of the present provide bladed servers. In one embodiment, a bladed server has a chassis containing a plurality of blades, where at least one of the blades is a server blade. One or more fans are disposed on at least one of a front and rear of the chassis. During operation, the fans create airflow along a horizontal path through the chassis from a front to a rear of the chassis. The flow path is substantially parallel to opposing faces and a faceplate of each of the plurality of blades. This eliminates the need for turning the flow, as is common for conventional bladed servers.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A bladed server comprising:
   a chassis having a front and rear;
   a plurality of blades comprising at least one server blade, the plurality of blades disposed within the chassis so that opposing faces and a faceplate of each of the plurality of blades are substantially perpendicular to the front and rear of the chassis; and one or more fans located at at least one of the front and rear of the chassis such that a flow-path at at least one of an inlet and exit of the one or more fans is substantially parallel to the opposing faces and faceplate of each of the plurality of blades.

2. The bladed server of claim 1, wherein the chassis is movably mountable within a rack cabinet.

3. The bladed server of claim 1, wherein the plurality of blades further comprise at least one of a storage blade, a management blade, and a network-switch blade.

4. The bladed server of claim 1, further comprising a backplane or midplane disposed within the chassis and oriented so that a faceplane of the backplane or midplane is substantially perpendicular to the front and rear, wherein each of the plurality of blades is electrically connected to the backplane or midplane.

5. The bladed server of claim 1, wherein the faceplate of each of the plurality of blades coincides with a side or top of the chassis.

6. The bladed server of claim 1, wherein the one or more fans are located at both the front and the rear of the chassis.

7. A bladed server comprising:

a rack cabinet;

one or more chassis movably mounted to the rack cabinet for moving between a first position and a second position, wherein the chassis is contained within the rack cabinet and a front of the one or more chassis coincides with a front of the rack cabinet while in the first position and wherein the chassis extends from the front of the rack cabinet while in the second position;

a plurality of blades comprising at least one server blade, each of the plurality of blades having opposing faces and a faceplate, the plurality of blades disposed within the chassis so that the opposing faces and the faceplate of each of the plurality of blades are substantially perpendicular to the front of the one or more chassis; and one or more fans located at at least one of the front and a rear of the one or more chassis such that a flow-path at at least one of an inlet and exit of the one or more fans is substantially parallel to the opposing faces and faceplate of each of the plurality of blades.

8. The bladed server of claim 7, wherein the plurality of blades further comprise at least one of a storage blade, management blade, and network-switch blade.

9. The bladed server of claim 7, further comprising a backplane or midplane disposed within the chassis and oriented so that a faceplane of the backplane or midplane is substantially perpendicular to the front and rear of the one or more chassis, wherein each of the plurality of blades is electrically connected to the backplane or midplane.

10. The bladed server of claim 7, wherein the faceplate of each of the plurality of blades coincides with a side or top of the one or more chassis.

11. A method for manufacturing a bladed server, the method comprising:

disposing a plurality of blades within a chassis so that opposing faces and a faceplate of each of the plurality of blades are substantially perpendicular to a front and rear of the chassis, the plurality of blades comprising at least one server blade; and disposing one or more fans at at least one of the front and rear of the chassis such that a flow-path at at least one of an inlet and exit of the one or more fans is substantially parallel to the opposing faces and faceplate of each of the plurality of blades.

12. The method of claim 11, further comprising orienting a backplane or midplane within the chassis so that a faceplane of the backplane or midplane is substantially perpendicular to the front and rear of the chassis.

13. The method of claim 11, wherein disposing the plurality of blades within the chassis comprises electrically connecting each of the plurality of blades to a backplane or midplane disposed within the chassis and oriented so that a faceplane of the backplane or midplane is substantially perpendicular to the front and rear of the one or more chassis.

14. The method of claim 11, further comprising movably mounting the chassis to a rack cabinet for moving between a first position and a second position, wherein the chassis is contained within the rack cabinet and the front of the chassis coincides with a front of the rack cabinet while in the first position and wherein the chassis extends from the front of the rack cabinet while in the second position.

15. The method of claim 11, wherein disposing the one or more fans at at least one of the front and rear of the chassis comprises disposing the one or more fans at both the front and rear of the chassis.

16. A method for cooling a bladed server, the method comprising:

orienting a plurality of blades of the bladed server within a chassis so that a faceplate and opposing faces of each of the plurality of blades are substantially perpendicular to a front of the chassis, wherein one or more of the plurality of blades is a server blade;

disposing one or mare fans at at least one of the front and a rear of the chassis such that a flow-path at at least one of an inlet and exit of the one or more fans is substantially parallel to the opposing faces and faceplate of each of the plurality of blades; and creating a substantially horizontal airflow using the one or more fans that enters substantially horizontally at the front of the chassis, flows substantially horizontally along the opposing faces of each of the plurality of blades, and exits substantially horizontally at the rear of the chassis.

17. The method of claim 16, wherein disposing the one or more fans at at least one of the front and rear of the chassis comprises disposing the one or more fans at both the front and rear of the chassis.

18. A bladed server comprising:

means for containing a plurality of blades comprising at least one server blade; and means for creating an airflow through the blade containing means that is located such that a flow-path at at least one of an inlet and exit of the airflow creating means is substantially parallel to opposing faces and a faceplate of each of the plurality of blades.

19. The bladed server of claim 18, wherein the blade containing means comprises a chassis.

20. The bladed server of claim 19, wherein the airflow creating means comprises one or more fans.

21. The bladed server of claim 19, wherein the airflow creating means comprises one or more fans located at both a front and rear of the chassis.

22. The bladed server of claim 19, wherein the chassis movably mounted within a rack cabinet.

23. The bladed server of claim 19, further comprising means for electrically connecting each of the plurality of blades thereto disposed within the blade containing means.

24. The bladed server of claim 19, wherein the blade containing means is movably disposed within a means for containing a plurality of blade containing means.

* * * * *